United States Patent
Rose

[19]

[11] Patent Number: 5,905,659
[45] Date of Patent: May 18, 1999

[54] TRAINING A RECURSIVE FILTER BY USE OF DERIVATIVE FUNCTION

[76] Inventor: Ralph E. Rose, 1324 S. Winchester Blvd. #38, San Jose, Calif. 95128

[21] Appl. No.: 08/946,324

[22] Filed: Oct. 7, 1997

[51] Int. Cl.[6] .................................................. G06F 17/10
[52] U.S. Cl. ...................................... 364/724.19; 375/232
[58] Field of Search .......................... 364/724.19, 724.2; 375/232

[56] References Cited

U.S. PATENT DOCUMENTS

| | | | |
|---|---|---|---|
| 4,751,663 | 6/1988 | Yamazaki ................................. | 364/724 |
| 5,226,057 | 7/1993 | Boren ...................................... | 375/103 |
| 5,335,020 | 8/1994 | Dieterich ................................. | 348/614 |
| 5,337,366 | 8/1994 | Eguchi et al. .......................... | 381/71 |
| 5,557,646 | 9/1996 | Honma .................................... | 375/232 |
| 5,638,439 | 6/1997 | Kawada et al. ......................... | 379/411 |
| 5,751,902 | 5/1998 | Hofmann ............................ | 364/724.19 |
| 5,774,564 | 6/1998 | Eguchi et al. ..................... | 364/724.19 |

*Primary Examiner*—Tan V. Mai
*Attorney, Agent, or Firm*—Thomas Schneck; George B. F. Yee

[57] ABSTRACT

A method of training a recursive filter comprises updating recursive parameters of the filter with delta values computed from sampling of an error signal and obtaining derivative terms of the output signal with respect to the parameters. Adaptation using derivatives for FIR filters is known, but this technique was not available for IIR filters because of the unavailability of the derivative values. However, when it is realized that the derivative itself is recursive, a parameter derivative function is obtained which will produce derivative terms for updating the filter parameters with acceptable filter performance.

14 Claims, 9 Drawing Sheets

TRAINING A RECURSIVE FILTER BY USE OF DERIVATIVE FUNCTION

TECHNICAL FIELD OF THE INVENTION

The present invention relates generally to digital filter systems and more specifically to adaptive recursive filters.

BACKGROUND OF THE INVENTION

An adaptive signal processing system is a system that is capable of altering or adjusting its parameters in such a way that its behavior, through contact with its environment, changes to approximate a desired response. A common application is in the field of telephony where problems in acoustic echo cancellation, line echo cancellation and the like readily lend themselves to solutions based on adaptive signal processing techniques. Other fields of use include mechanical systems, radar, sonar, and biological systems.

A commonly used architecture for implementing adaptive systems is the finite impulse response (FIR) filter. The algorithm commonly used for training this type of filter involves adjustment of the parameters based on the error and the derivative of the output with the parameters. This algorithm up until this point has not been available for the training of IIR filters due to the inability to determine the value of the derivatives. The following is a listing of the techniques used to overcome this deficiency in the training of IIR filters.

For example, U.S. Pat. No. 5,638,439 relates to echo cancellation in a transmission line and teaches a method of updating filter coefficients by taking the absolute values of the coefficients and scaling the resulting vector.

U.S. Pat. No. 5,418,849 is directed to a procedure for adapting a recursive filter using an algorithm based on a variation of Kalman's algorithm. The '849 patent modifies the Kalman algorithm by taking the decimation of the square error rather than the voice signal to achieve improved speed of convergence. U.S. Pat. No. 5,337,366 discloses in FIG. 1 a filter (16) comprising a non-recursive portion (18) and a recursive portion (17). Coefficient control stages (19–21) serve to update the filter coefficients. The '366 patent shows the use of finite impulse response (FIR) filter stages (31, 32) to filter the signals prior to handling by the coefficient control stages.

U.S. Pat. No. 5,335,020 describes a ghost canceling application used in video systems. The patent addresses the inherent instability of adapting IIR filters by providing for a step of determining the onset of such instabilities. The determination is accomplished by summing the weighting coefficients; if the sum exceeds 1 then the filter may be unstable, and appropriate action can be taken.

U.S. Pat. No. 5,226,057 discloses a digital notch filter implemented using an adaptive IIR filter. The filter coefficients are updated in accordance with equations disclosed beginning at column 2, line 62 of the reference.

U.S. Pat. No. 4,751,663 is directed to an IIR filter wherein a polynomial multiplies both the denominator and the numerator of the system transfer function to remove a $z^{-1}$ term in the denominator. This permits high speed operation with a pipeline processing technique.

SUMMARY OF THE INVENTION

The present invention is a method of adapting a recursively defined control processing system that includes obtaining derivative terms of the output with respect to each of the filter coefficients which define a recursive filter. These derivative terms are combined with an error signal in a computation of the update values for the filter coefficients. Subsequent to one such cycle of updating the coefficients, resulting transients in the filter are allowed to settle prior to repeating a next cycle of updating.

In a preferred embodiment, the error signal is sampled over a period of time so that a set of error samples is collected. The derivatives are obtained by use of derivative functions which are functions whose level is representative of the derivative of the filter's output with respect to the recursive parameters in question. By obtaining and using the derivatives of the output with respect to all parameters, the technique common to the training of FIR filters can be used. Since the technique for the development of these derivative functions is recursive, some restrictions must be placed on how often the parameters can be updated, and that sufficient time is allowed to pass after an update before new update data is collected.

The technique just discussed for adjustment of the recursive parameters places no restriction on the use of non-recursive parameters, and so it is a natural process to combine the techniques used for adjustment of both parameters into one overall system. The discussion in this application will center around a sampled system and the use of z-transforms, but the techniques discussed should not be considered restricted to them.

Further in accordance with the present invention, a control processing apparatus comprises means for receiving an input signal, means for filtering the input signal to produce an output signal, means for producing an error signal, and means for updating the parameters which characterize the filtering means. In accordance with the invention, the filter parameters implement a recursive element; and in an alternate embodiment of the invention, the filtering means further includes a non-recursive element. The updating means includes a derivative function generator for obtaining derivative terms of the output signal with respect to the filter parameters. The derivative terms are combined with the error terms to produce adjustment values to be subsequently combined with the parameters. The filter further includes a delay means for providing a delay period before the updating means proceeds with its next iteration.

BEST MODE FOR CARRYING OUT THE INVENTION

Figure 1:
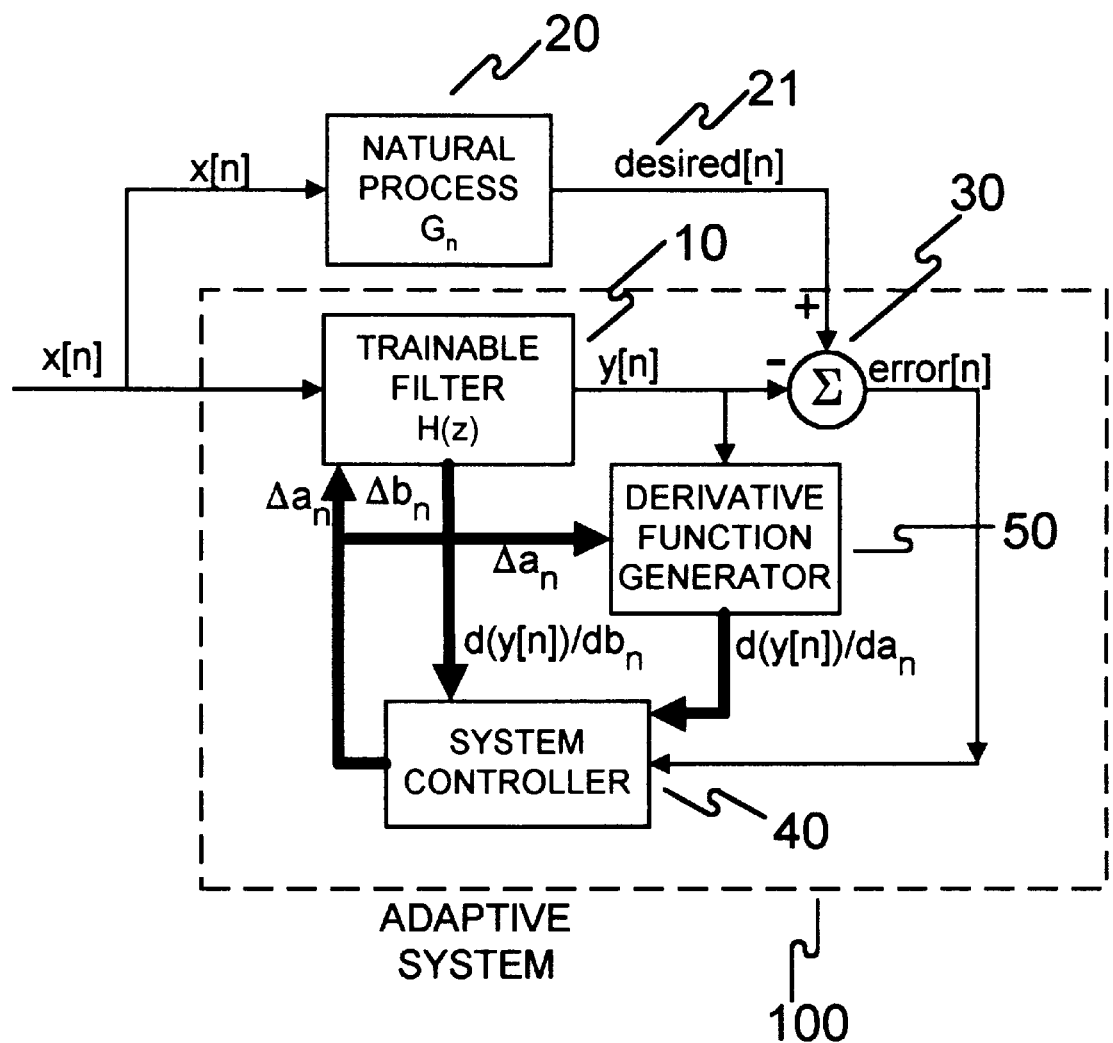
FIG. 1 shows a block diagram of an adaptive system using a combination filter with a derivative function generator for generating derivative functions for recursive parameters and flow graph for updating both recursive and non-recursive parameters.

Referring to FIG. 1, the present invention describes a process so that the output of filter 10 can be made more equal to the output of filter 20. While many systems have been built to perform this function, none have incorporated recursive elements that are adjusted using the same techniques common to non-recursive systems. The use of recursive elements should reduce the processing time required by filter 10 to produce the desired output. Filter 20 of FIG. 1 is representative of some natural process, while filter 10 is typically a digital signal processing system whose response is being controlled. The remainder of the apparatus of FIG. 1 is representative of the signal flow taking place within the same processor used to process the signal in filter 10.

The adaptive system 100 includes filter 10 whose behavior is characterized by a set of recursive and non-recursive filter coefficients (parameters). The broad lines from filter 10 and the derivative function generator 50 represent the derivatives of the parameters with the output of filter 10. These derivatives are used with the error signal to determine the amount the parameters should be changed. The signal flow from system controller (parameter adjustment block) 40 is the amount the parameters should be changed as calculated in each update interval. There are three intervals of interest: (1) filter process interval, also referred to as the sample period, (2) data collection interval and (3) update interval. Each interval in the list is typically an integral multiple of the preceding one in the list.

The filter process interval is the interval between each recalculation of the filter's output. The data collection interval is the interval between the collection of data used in determining how the value of the parameters should be changed. The update interval is the interval between changes of the values of the parameters used in the filter.

The change of parameter values calculated during each data collection interval is averaged with the values collected during previous data collection intervals and is fed to update the parameters values during an update interval. The purpose of this averaging is to reduce how often the value of the parameters are changed and to permit any transients caused by their change to die out before any new adjustment data is collected.

Figure 2A:
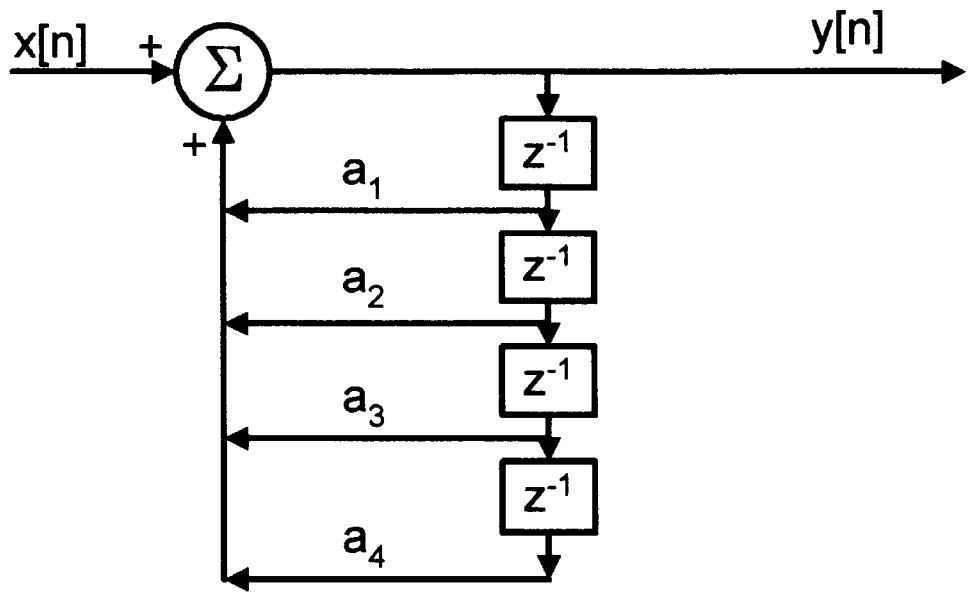
FIGS. 2A–2D show block diagrams of the filters common to the state of the art—recursive filter, non-recursive filter, combination filter, canonic form of combination filter.
Figure 2B:
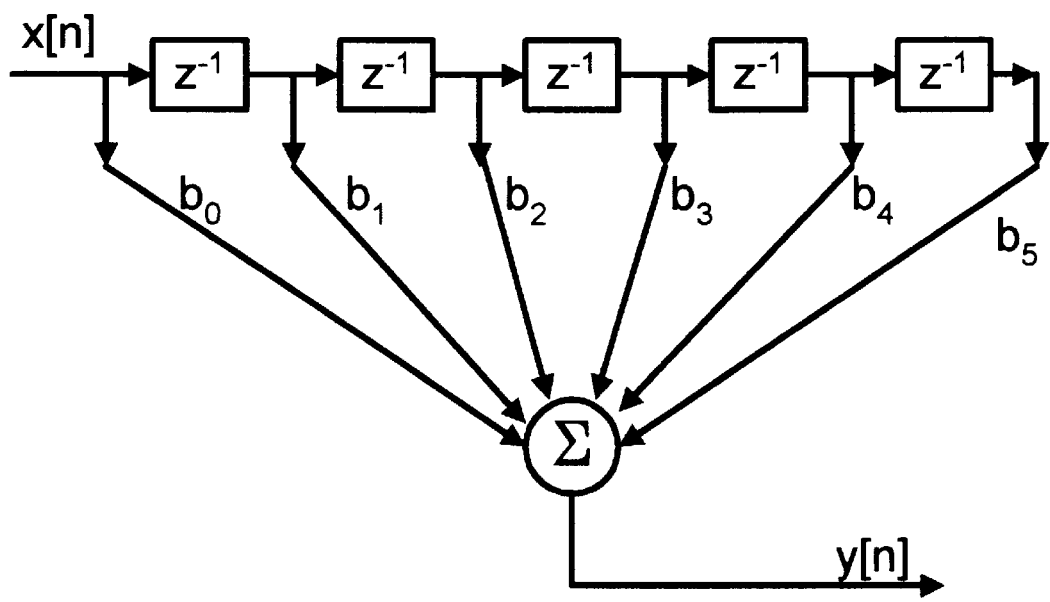
Figure 2C:
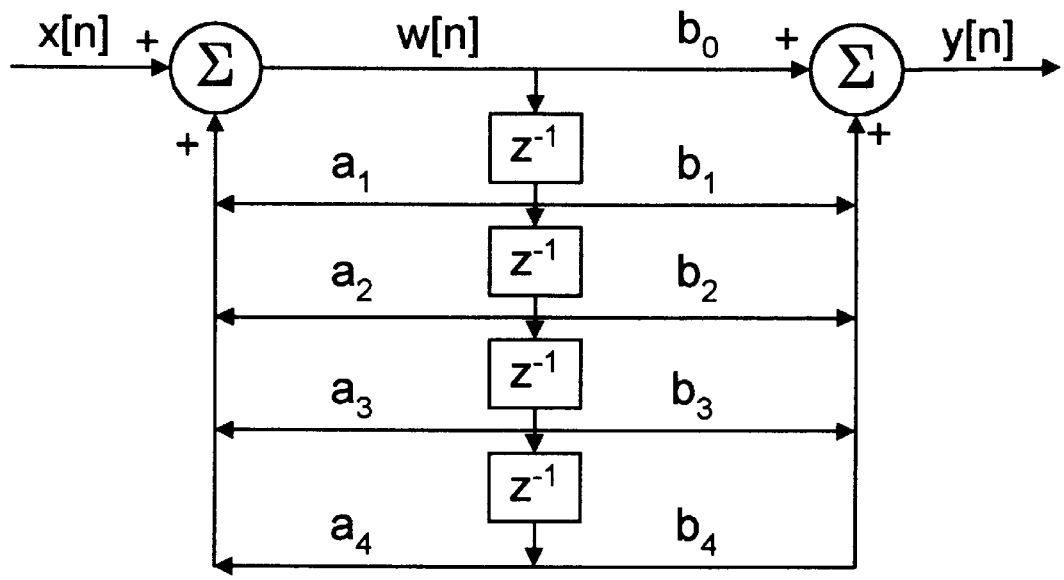
Figure 2D:
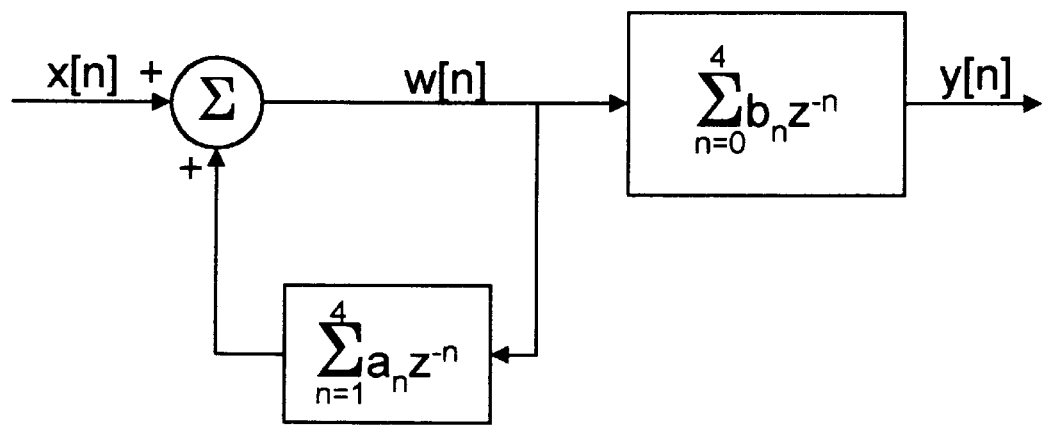

Turning for a moment to FIG. 2A, a filter 10 comprising purely recursive parameters $a_i$ is shown. FIG. 2B shows a filter comprising purely non-recursive parameters $b_i$. FIG. 2C shows a filter 10 comprising a combination of recursive and non-recursive parameters, while FIG. 2D shows in canonic form the filter shown in Fig. 2C. It is these parameters $a_i$, $b_i$ that are the targets of the update method of the present invention.

Continuing with FIG. 1, the output signal y produced by filter 10 feeds into summer 30 and is subtracted from the desired signal 21 to produce an error signal. The output signal also feeds into a derivative function generator 50 which produces the derivative signal representing derivatives of the output signal with respect to each of the recursive filter parameters. Both the error signal and the derivative terms are combined in the system controller 40 to produce delta values $\Delta a_i$, $\Delta b_i$. The parameters comprising the filter 10 are updated by system controller 40 by adding the parameter delta values to their corresponding parameter values during the update interval.

Figure 4A:
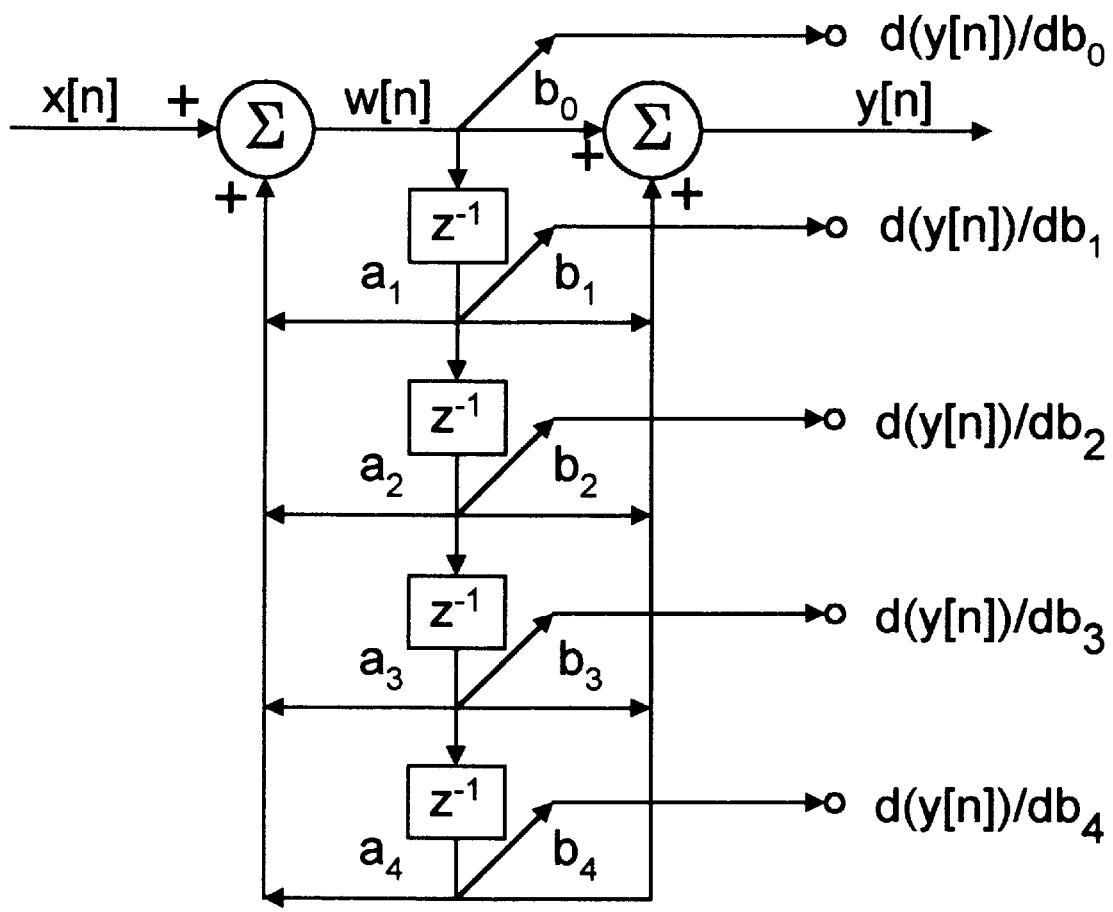
FIGS. 4A–4B illustrate a combination filter with the derivative functions for all parameters, recursive and non-recursive.

As can be seen in FIG. 1, the system controller 40 receives two types of derivative signals: derivative terms of the non-recursive elements $b_i$; and derivative terms of the recursive elements $a_i$. The derivation of the derivative functions of the output signal with respect to non-recursive parameters is performed as shown in FIG. 4A and will be discussed later.

However, a problem is encountered when adapting a recursive filter by using derivatives. The problem lies in the computation of the derivative of the output with respect to the recursive parameters. Since the parameters are in the feedback path, they are hypersensitive to adjustment and the resulting filter has a tendency not to be stable. In accordance with the present invention, the problem is overcome when it is realized that the definition of the derivative is also recursive.

Figure 3:
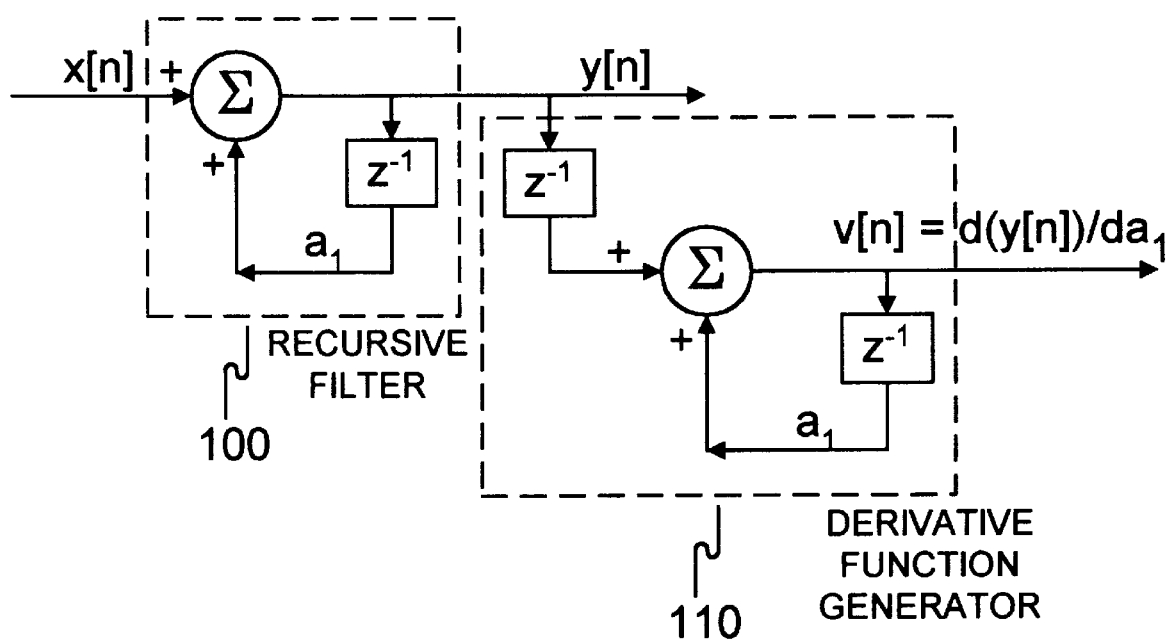
FIGS. 3 shows a basic recursive filter with a derivative function generator.

Consider the recursive filter 100 illustrated in FIG. 3, comprising a single parameter $a_1$. Its output y is defined by the following equation:

$$y[n]=a_1y[n-1]+x[n] \tag{1}$$

Taking the derivative of each side with respect to the parameter $a_1$ results in the following:

$$\frac{\mathrm{d}y[n]}{\mathrm{d}a_1} = a_1\mathrm{d}\frac{y[n-1]}{\mathrm{d}a_1} + y[n-1] \tag{2}$$

By making the following substitution in Equation (2):

$$v[n] = \frac{\mathrm{d}(y[n])}{\mathrm{d}a_1} \tag{3}$$

the result is:

$$v[n]=a_1v[n-1]+y[n-1] \tag{4}$$

The flow graph permitting the development v[n] from y[n] is shown in FIG. 3 and is shown as derivative function generator 110. It has been shown that v[n] is a function whose level is representative of the derivative of the function y[n] with respect to $a_1$. A short hand notation would be to refer to v[n] as a "derivative function" of the function y[n] with respect to parameter $a_1$. The availability of such a function permits the training of a IIR filter to use the same techniques previously reserved for the training of FIR filters. It is believed that the only reason the prior art techniques for the training of IIR filters where developed was because the technique of the present invention did not exist. This technique however has a major drawback that must be understood so it can be avoided. A change of the value of $a_1$ in the filter not only disturbs the original filter but also introduces transients into the derivative function. When using the value of the derivative function to calculate the change in the value of $a_1$, care must be taken to assure that any transients introduced by a change in the value $a_1$ have had sufficient time to die out.

An aspect of the present invention addresses the need for the filter to stabilize after each update in order to allow the transients to be sufficiently attenuated. Before presenting this aspect of the invention, the discussion will now turn to an alternative method for producing the derivative function. Use of z-Transforms Returning to Equation (1), an alternate approach for obtaining the parameter derivative function is possible via the use of z-transforms. Manipulating Equation (1) to put it in the form a z-transform results in:

$$Y(z)=H(z)X(z) \tag{5}$$

$$\frac{\mathrm{d}(Y(z))}{\mathrm{d}a_1} = \frac{\mathrm{d}(H(z))}{\mathrm{d}a_1}X(z) = \left(\frac{\frac{\mathrm{d}(H(z))}{\mathrm{d}a_1}}{H(z)}\right)[H(z)X(z)] \tag{6}$$

Since H(z)X(z) equals Y(z), Equation (6) can be written as:

$$V(z)=G(z)Y(z) \tag{7}$$

Where V(z) is the z-transform of v[n] used in Equation (4). Since H(z) as defined by Equation (1) is:

$$H(z) = 1/1 + a_1 z_{-1} \quad (8)$$

the derivative of H(z) with respect to $a_1$ is:

$$\frac{d(H(z))}{da_1} = \frac{z^{-1}}{(1 - a_1 z^{-1})^2} \quad (9)$$

and thus the value of G(z) is equal to:

$$G(z) = \frac{\frac{z^{-1}}{(1 - a_1 z^{-1})^2}}{\frac{1}{1 - a_1 z^{-1}}} = \frac{z^{-1}}{1 - a_1 z^{-1}} \quad (10)$$

G(z) is the transfer function of Equation (4), thus proving the that the derivative function has the same definition regardless of the technique used to define it -i.e. by the use of z-transforms or by taking the derivative of the transfer equation itself.

Next is a generalization of the results previously obtained to cover the general transfer equation:

$$y[n] = \sum_{k=1}^{N} a_k y[n-k] + \sum_{k=0}^{M} b_k x[n-k] \quad (11)$$

In this process, the derivative functions for both the recursive and non-recursive parameters will be defined. First, the derivative functions for recursive parameters will be determined.

Equation (11) has the z-transfer function of:

$$H(z) = \frac{\sum_{k=0}^{M} b_k z^{-k}}{1 - \sum_{k=1}^{N} a_k z^{-k}} \quad (12)$$

The transfer function of G(z) will be determined for a general a parameter $a_k$. The first step in this process is to take the derivative of H(z) with respect to $a_k$.

$$\frac{d(H(z))}{da_k} = \frac{z^{-k}\left(\sum_{j=0}^{M} b_j z^{-j}\right)}{\left(1 - \sum_{j=1}^{N} a_j z^{-j}\right)^2} \quad (13)$$

Using the definition of G(z), the value of G(z) can now be determined:

$$G(z)|_{a_k} = \frac{\frac{d(H(z))}{da_k}}{H(z)} = \frac{z^{-k}}{1 - \sum_{j=1}^{N} a_j z^{-j}} \quad (14)$$

This z-transform can be converted directly to the time domain as:

$$\frac{d(y[n])}{da_k} = v[n] = \sum_{j=1}^{N} a_j v[n-j] + y[n-k] \quad (15)$$

for all k between 1 and N

An alternate technique can be used to develop the derivative functions based on the rearrangement of the z-transfer function:

$$G(z)|_{a_k} = \frac{z^{-k}}{1 - \sum_{j=1}^{N} a_j z^{-j}} = \left(\frac{1}{1 - \sum_{j=1}^{N} a_j z^{-j}}\right) z^{-k} \quad (16)$$

Transforming this z-transfer function into the time domain leads to the following sequence of equations. By use of the following sequence all derivative functions can be defined with the use of only one recursive function.

$$\frac{d(y[n])}{da_k} = w[n-k] \quad (17)$$

where:

$$w[n] = \sum_{j=1}^{N} a_j w[n-j] + y[n] \quad (18)$$

Next, is an explanation of a technique that will permit the development of a difference technique for generating y[n] and simultaneously develop all the derivative functions for the non-recursive parameters. To accomplish this objective it is necessary to re-arrange the following z-transfer equations.

$$H(z) = \frac{\sum_{j=0}^{M} b_j z^{-j}}{1 - \sum_{j=1}^{N} a_j z^{-j}} = \left(\frac{1}{1 - \sum_{j=1}^{N} a_j z^{-j}}\right) \sum_{j=0}^{M} b_j z^{-j} \quad (19)$$

$$\frac{d(H(z))}{db_k} = \frac{z^{-k}}{1 - \sum_{j=1}^{N} a_j z^{-j}} = \left(\frac{1}{1 - \sum_{j=1}^{N} a_j z^{-j}}\right) z^{-k} \quad (20)$$

The second parts of equations (19) and (20) lead to the following set of recursive equations.

$$r[n] = \sum_{j=1}^{N} a_j r[n-j] + x[n] \quad (21)$$

$$y[n] = \sum_{j=0}^{M} b_j r[n-j] \quad (22)$$

$$\frac{d(y[n])}{db_k} = r[n-k] \quad (23)$$

Figure 4B:
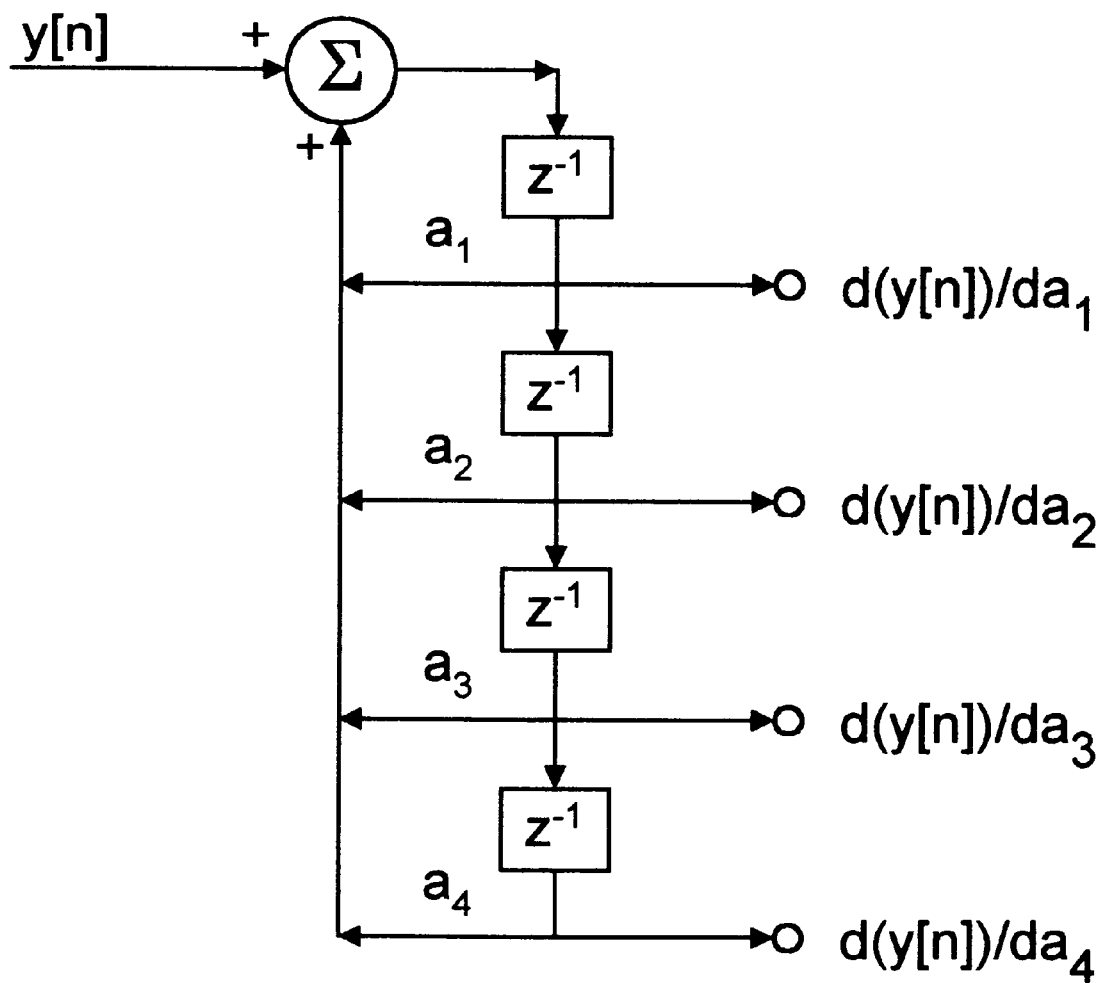

By using the Equations (17), (18) and (21)–(23), the necessary information is at hand to draw a flow graph for developing all derivative functions required for training of the network. This flow graph is shown in FIGS. 4A and 4B.

Thus, the derivative function generator 50 for a general combination filter such as the one shown in FIG. 2C generates derivative terms by updating parameter derivative functions as exemplified in Equations (17) and (18). The flow graph of FIG. 4B follows from the parameter derivative functions of Equations (17) and (18), and defines the transfer function of the derivative function generator 50.

Returning to FIG. 1, the system controller 40 produces parameter delta values $\Delta a_i$, $\Delta b_i$ as a function of the parameter derivative functions and the error signal. Usually, the delta values are simply proportional to the product of the parameter derivative function and the error signal:

$$\Delta a_i = \left(\frac{d(y[n])}{da_i}\right)\frac{\text{ERROR}}{K} \quad (24)$$

$$\Delta b_i = \left(\frac{d(y[n])}{db_i}\right)\frac{\text{ERROR}}{K} \quad (25)$$

Where the parameters are updated by:

$$a_i = a_i + \Delta a_i, b_i = b_i + \Delta b_i \quad (26)$$

While K can be assigned an arbitrary positive constant value as is done in the L.M.S. algorithm, it can also be assigned a value that varies for each sample. Using the value calculated using the following equation means that the error will be exactly eliminated.

$$K = \sum_{i=0}^{N}\left(\frac{d(y[n])}{db_i}\right)^2 + \sum_{i=1}^{N}\left(\frac{d(y[n])}{da_i}\right)^2 \quad (27)$$

The sum performed in Equation (27) is carried out over all parameters being adjusted (both recursive and non-recursive).

The statement that the error will be exactly eliminated if K is set to a given value is based on the assumption that you are making the adjustment over a linear range. This assumption may not be valid since we are dealing with recursive function which have a very non-linear transfer function. The assumption of linearity is more likely to be true the smaller the change in parameter values are make in each parameter update interval.

There are two problems that remain to be solved: 1) how long to wait after the parameters are updated before new parameter adjustment data can be collected; 2) how to collect and combine data from multiple error correction samples.

Figure 7:
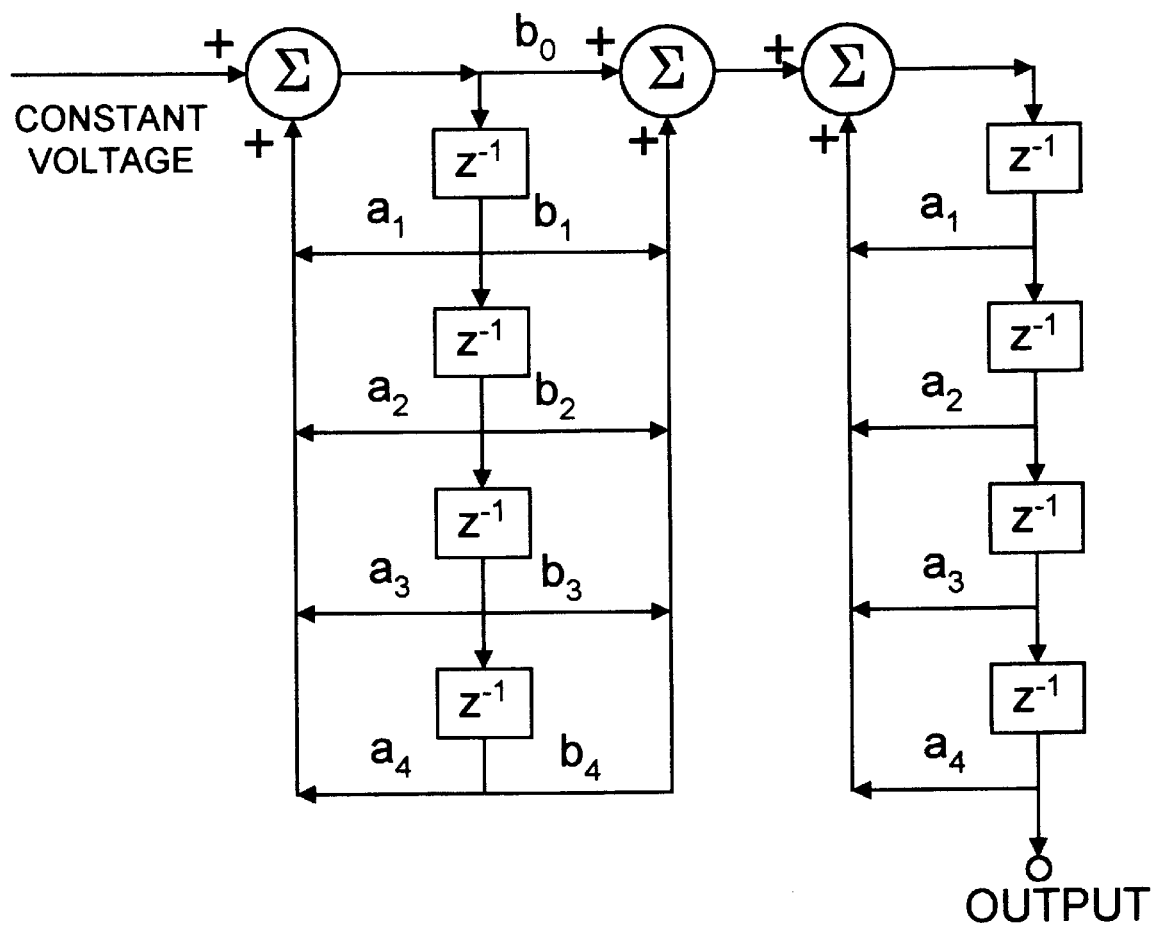
FIG. 7 is a Test Circuit used for the filter in FIGS. 4A–4B to determine how long to wait after parameter update before collecting new data.

The question of how long to wait is determined by the amount of time required by the system (both adaptive filter and derivative function generator) to stabilize. In fact this is the test that can be used; not on an experimental bases, but as a technique to be used to determine the delay between every parameter update and data collection. Since the filter is a synthetic network in which all parameters are known, the network can be duplicated. This second network shown by the test circuit in FIG. 7 is equivalent to the filter and derivative function generator it replaces shown in FIG. 4A and 4B. This second network can be used to determine when the derivative functions have reached their stable values; i.e. when the transients are sufficiently attenuated. To do this, a constant value is fed into the second network (see FIG. 7) so that the change of parameter values generates a step output. When the network receives a constant input, the stable level of output is:

$$\text{OUTPUT} = \frac{(\text{SUM}_b)(\text{INPUT})}{(1 - \text{SUM}_a)^2} \quad (28)$$

Where:

$$\text{SUM}_b = \sum_{k=0}^{M} b_k \qquad \text{SUM}_a = \sum_{k=1}^{N} a_k \quad (29)$$

and INPUT is the value of the constant voltage supplied to the input of the network.

A window of acceptable error in the value of the derivative function can be established. The operator can use the time required for the derivative function to reach stability (i.e. the output falls within a user-defined range of output levels deemed to be acceptable for a given application of the filter) as the time that system controller 40 needs to wait between updating of the parameters and collecting the data used to perform the parameter updates.

The second problem that needs to be solved is how to combine the data from multiple parameter update samples. The safest technique is just to average the $\Delta a_k$ and $\Delta b_k$ values calculated based on the individual data update samples to obtain an overall parameter update value that will be used to actually update the parameters. This technique is illustrated in the following equation:

$$\Delta a_{k,\text{actual}} = \frac{1}{NUM}\sum_{n=1}^{NUM}\Delta a_k(n) \quad (30)$$

$$\Delta b_{k,\text{actual}} = \frac{1}{NUM}\sum_{n=1}^{NUM}\Delta b_k(n) \quad (31)$$

Figure 5:
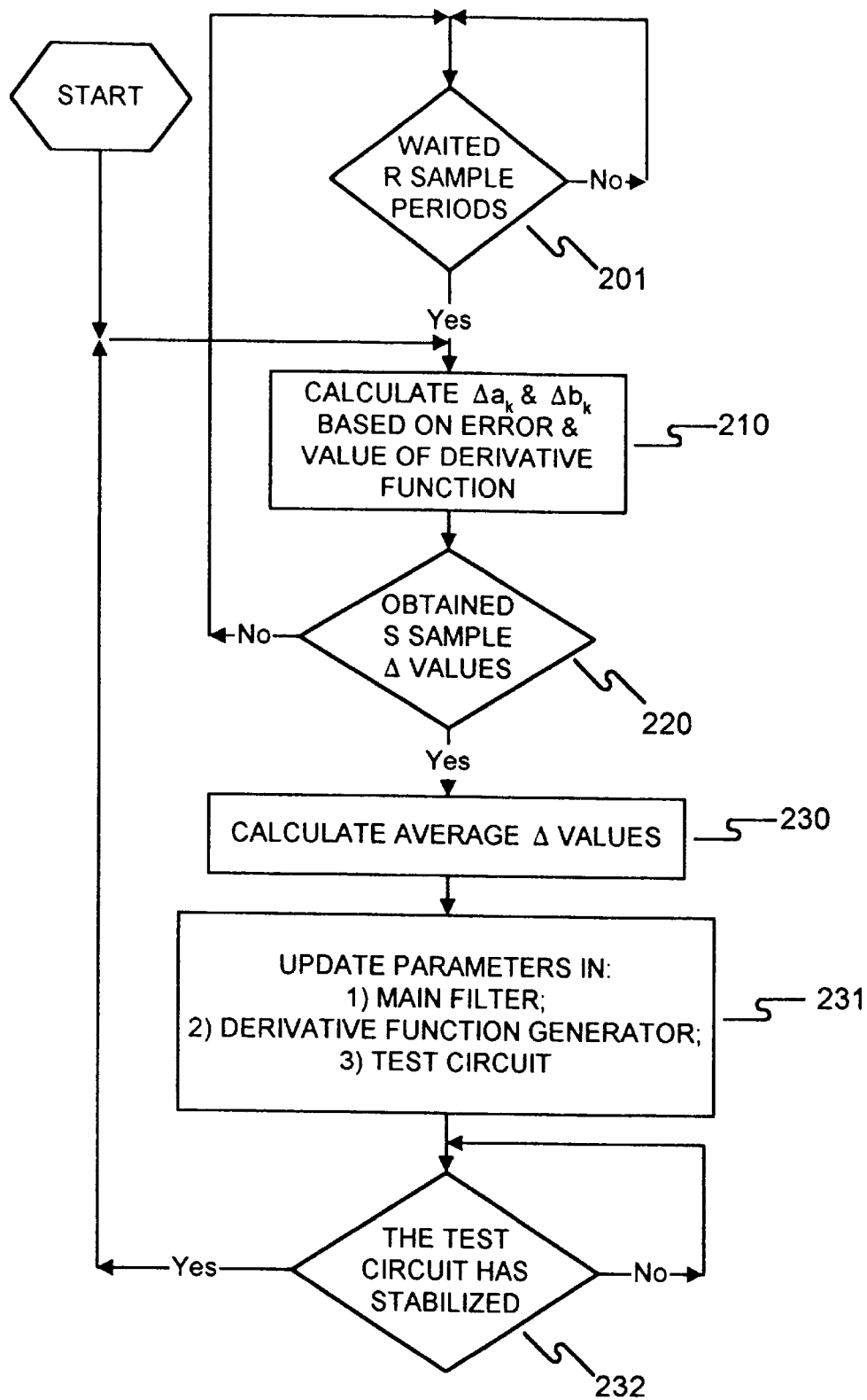
FIG. 5 is a block diagram of the training sequence used for training a recursive filter.
Figure 6:
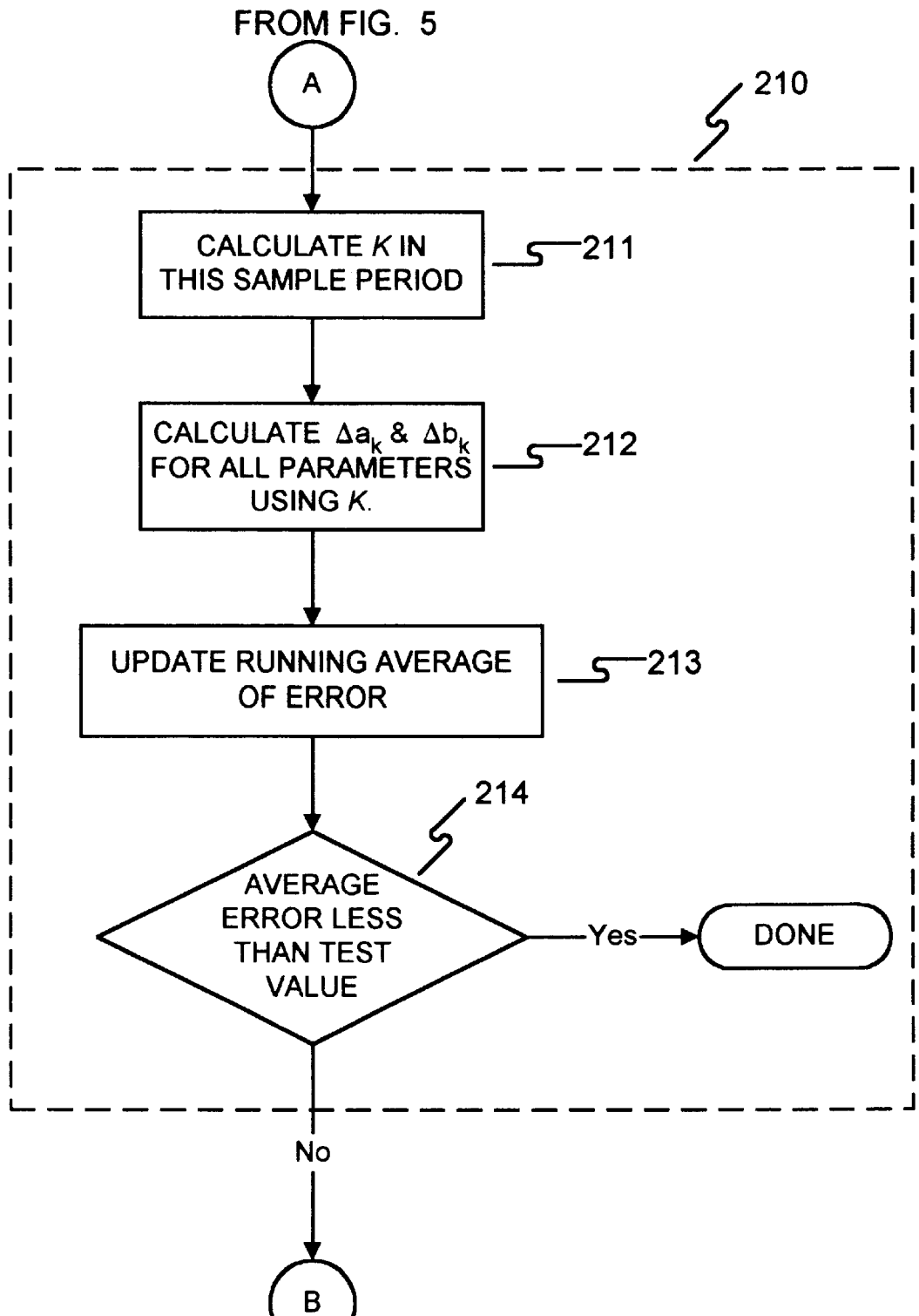
FIG. 6 is a breakdown of block 210 used in FIG. 5.

The overall technique that can be used for the training of a recursive filter is shown in FIG. 5. The sequence begins at the start symbol and terminates in block 210 based upon a test of the average error observed during parameter update samples. Block 210 can be broken down into small steps shown in FIG. 6. Because we are dealing with a recursive filter and the value of the derivative functions are capable of varying over such a wide range it was decided that it is necessary to use a K value based on the value of the derivative function. The calculation of the K value is shown in block 211 in FIG. 6 and is accomplished using Equation (27). The calculation of the $\Delta a_k$ and $\Delta b_k$ values is done in block 212. Although a value of K calculated by Equation (27) varies as function of the derivative functions, this will be the value used. The values of $\Delta a_k$ and $\Delta b_k$ may be further reduced by another constant in order to assure stability of the system during training. The running average of Error calculated in step 213 is done by using the following equation.

$$(\text{Average Error}) = \frac{j}{j+1}(\text{Average Error}) + \frac{1}{j+1}\text{ABS}(\text{Error}) \quad (32)$$

where the symbol Error represents the error that occurred during this sample period. The value of j in the above equation is an empirically derived constant typically in the range of 10 to 1000 and has the effect of filtering out rapid fluctuations. The Average Error appearing on the right hand side of the equation is the old value being updated or replaced by to new value appearing on the left hand side. The ABS function in the above equation returns the absolute value of the value passed to it. The Average Error calculated using Equation (32) is tested in step 214 to determine if it is necessary to continue the process of updating the filter parameters. Returning now to FIG. 5, after the completion of step 210, step 220 is performed to determine if enough update samples of $\Delta a_k$ and $\Delta b_k$ have been accumulated. If not the process returns to step 201 to wait R sample periods before calculating another set of values of $\Delta a_k$ and $\Delta b_k$. If enough update samples of $\Delta a_k$ and $\Delta b_k$ have been obtained, the average $\Delta a_k$ and $\Delta b_k$ is calculated using Equations (31) and (31). These are values of $\Delta a_k$ and $\Delta b_k$ that will be used in step 231 to change the value of the network parameters. This change of network parameters must be done in three locations—the main filter, derivative function generator and test circuit. The test circuit shown in FIG. 7 is identical to the combination main filter and derivative function generator in parameters and structure. The only difference is that the test circuit does not process the input signal, but instead receives a constant input signal. This permits the monitoring of the disturbance caused by change of parameters. The change of value of parameters in the test circuit will cause a fluctuating signal to appear at the test circuit's output. This signal will eventually settle out, but this process takes time. It is this time that is used determine how long the system should wait before collecting new update data, after updating the parameters in step 231. The test to determine if the test circuit has settled down is performed in step 232. When the test circuit has settled down, step 210 is repeated. This process of calculating $\Delta a_k$ and $\Delta b_k$ update values is repeated until the Average Error calculated in step 213 is below the test value.

The R sample period used in step 201 is set to a value to assure the system will obtain good statistical samples of the error of the output signal.

I claim:

1. A method of adapting a filter having a plurality of recursive filter parameters, said recursive filter effective for producing an output signal in response to receiving an input signal, the method comprising:

subtracting said output signal from a desired signal to produce an error signal;

producing a plurality of derivative functions, each of whose level is representative of derivative of said output signal with respect to a particular recursive filter parameter; and updating each of said recursive filter parameters based on said derivative functions and said error signal.

2. The method of claim 1 further including:

delaying for a period of time subsequent to said step of updating, in order to allow transient signals arising from said step of updating to subside;

repeating above said steps;

whereby said recursive filter remains stable during the adapting thereof.

3. The method of claim 2 wherein said period of time is determined by:

providing a test circuit which duplicates said filter;

applying a constant input to said test circuit;

monitoring an output of said test circuit; and measuring the time required for said test circuit output to remain stable within a user-defined window.

4. The method of claim 1 wherein for each recursive filter parameter, said step of updating includes computing a change of value of said filter parameter, said change of value being proportional to a level of its corresponding derivative function and said error signal.

5. The method of claim 1 further including updating non-recursive filter parameters of said filter.

6. A method of adapting a filter having a plurality of recursive and non-recursive parameters, said filter effective for producing an output signal in response to receiving an input signal, the method comprising:

subtracting said output signal from a desired signal to produce an error signal;

producing a plurality of derivative functions, each of whose level is representative of derivative of said output signal with respect to a particular recursive parameter; and producing a plurality of derivative functions, each of whose level is representative of derivative of said output signal with respect to a particular non-recursive parameter; and updating each said recursive and non-recursive parameter based upon its corresponding derivative function and said error signal.

7. The method of claim 6 further including:

delaying for a period of time subsequent to said step of updating, in order to allow transient signals arising from said step of updating to subside;

repeating above said steps;

whereby said filter remains stable during the adapting thereof.

8. The method of claim 6 wherein said derivatives are computed and said error samples are taken for each of said N periods of time.

9. The method of claim 8 wherein said substep of computing a delta-value of step (c) includes evaluating the equation:

$$\Delta P_i = \sum_n \backslash(\backslash\%\ \backslash) \frac{\text{error}_n D_n(P_i)}{K}$$

where $\Delta P_i$ is said delta-value for a recursive parameter $P_i$;

$\text{error}_n$ is an error sample taken at a time $t_n$;

$D_n(P_i)$ is a derivative function of said output signal y with respect to parameter $P_i$; and K is an adjustment factor.

10. The method of claim 9 further including a substep of computing said adjustment factor K for each of said error samples by evaluating the equation:

$$K_n = \sum_i \backslash(\backslash\%\ \backslash)(D_n(P_i))^2$$

where $K_n$ is an adjustment factor corresponding to time $t_n$.

11. An adaptive recursive filter comprising:

input means for obtaining an input signal;

computing means, coupled to said input means, for producing an output signal, said computing means characterized by a plurality of recursive parameters;

error means, coupled to said computing means, for comparing said output signal with a desired output signal;

derivative function means for producing a plurality of signals, each signal representative of a derivative of said output signal with respect to one of said recursive filter parameters;

update means, coupled to said error means and said derivative function means, for updating said plurality of recursive parameters.

12. The adaptive filter of claim 11 wherein said update means includes delay means for delaying for a period of time between updates of said plurality of recursive parameters.

13. The adaptive circuit of claim 12 wherein delay means is a test circuit having the same parameters as said recursive circuit, said test circuit having a constant-valued input signal, whereby a delay period is established as the time required for an output signal of said test circuit to remain stable within a user-defined window.

14. The adaptive filter of claim 11 wherein said recursive filter further includes a plurality of non-recursive elements and means for updating said non-recursive elements.

* * * * *